(12) United States Patent
Wilson et al.

(10) Patent No.: US 6,759,794 B2
(45) Date of Patent: Jul. 6, 2004

(54) DISCHARGE LAMP WITH VENTED REFLECTOR

(75) Inventors: Carolyn Wilson, University Heights, OH (US); Daniel Polis, Cleveland Heights, OH (US); Matthew A. Bugenske, Cleveland Heights, OH (US)

(73) Assignee: General Electric Company, Schenectady, NY (US)

( * ) Notice: Subject to any disclaimer, the term of this patent is extended or adjusted under 35 U.S.C. 154(b) by 169 days.

(21) Appl. No.: 09/844,133

(22) Filed: Apr. 27, 2001

(65) Prior Publication Data

US 2002/0158558 A1 Oct. 31, 2002

(51) Int. Cl.[7] ................................................. H01J 5/16
(52) U.S. Cl. ........................... 313/113; 313/22; 313/24; 313/25; 313/12; 362/294; 362/373; 362/264
(58) Field of Search ............................. 313/113, 22, 24, 313/25, 12; 362/294, 373, 264

(56) References Cited

U.S. PATENT DOCUMENTS

| | | | | | |
|---|---|---|---|---|---|
| 4,053,759 | A | * | 10/1977 | Wilkinson | .................. 362/218 |
| 4,925,295 | A | * | 5/1990 | Ogawa et al. | ................. 353/57 |
| 5,909,955 | A | * | 6/1999 | Roorda | ........................ 362/368 |
| 6,133,676 | A | * | 10/2000 | Chen | ............................ 313/25 |
| 6,300,717 | B1 | * | 10/2001 | Ooms | ........................... 315/56 |
| 6,306,010 | B1 | * | 10/2001 | West et al. | .................... 451/36 |
| 6,509,674 | B1 | * | 1/2003 | Nakagawa | ................... 313/113 |

FOREIGN PATENT DOCUMENTS

EP          1 003 2020 A2    5/2000

* cited by examiner

*Primary Examiner*—Vip Patel
*Assistant Examiner*—Holly Harper
(74) *Attorney, Agent, or Firm*—Fay, Sharpe, Fagan, Minnich & McKee, LLP

(57) ABSTRACT

A high intensity discharge lamp assembly (10) has improved thermal venting. The discharge light source (12) is housed within a reflector body (20). Recesses (40) are circumferentially spaced around an open end (28) of the reflector body. A containment structure (50, 50', 50") provides a structure that serves the containment function without interfering with the thermal venting.

16 Claims, 3 Drawing Sheets

DISCHARGE LAMP WITH VENTED REFLECTOR

BACKGROUND OF THE INVENTION

1. Field of the Invention

This application relates to an inexpensive shield incorporated into a lamp assembly. More particularly, this invention relates to a high intensity discharge reflector lamp assembly, such as used in projector equipment, but need not necessarily be limited to this end use.

2. Discussion of the Art

Projector equipment often employs a high intensity discharge light source. Generally, the discharge light source operates at a high temperature/high pressure whereby the pressurized gas fill sealed in a light transmissive envelope is converted into a light emitting discharge plasma. Efficacy of the lamp assembly is directly related to the operating pressure and temperature of the lamp. It thus becomes important to operate at a high temperature without adversely impacting the surrounding environment.

It is important, therefore, to provide thermal venting for the lamp. In some instances this must be attained without impacting on the light emitting properties of the lamp assembly. That is, the light source is housed within a surrounding reflector body. The reflector body is positioned around the lamp to redirect light from the source through an open end or cover/lens that seals one end of the reflector body. An opposite end of the reflector body includes a reduced diameter neck or opening through which the electrodes of the discharge light source extend.

It is conventional with lamp assemblies of this type for the reflector body to be reinforced or employ a separate containment shield to contain a nonpassive failure of the light source. Unfortunately, the containment structure further impedes heat transfer and adds to an increased operating temperature, and thus reduced operating life, of the lamp.

Although alternative cooling structures have been suggested, they have been unnecessarily complex or expensive because of the need to machine the reflector to accommodate cooling features or provide a complex reflector assembly. For example, openings must be formed in the reflector body to allow air flow from the cooling fan to reach the interior cavity of the reflector body and thus reduce the operating temperature of the light source.

Accordingly, a need exists for a simple, yet effective solution to a containment structure that provides thermal venting for the lamp assembly.

BRIEF SUMMARY OF THE INVENTION

An improved lamp assembly includes a perforated or foraminous containment structure that provides effective thermal venting.

In a first embodiment, the assembly includes discrete perforated panel portions positioned over reflector body vent openings. The panel portions are disposed in spaced relation about the reflector body so as not to contribute to heat containment within the lamp assembly.

In one embodiment, the panel portions are interconnected by a structural member, namely a support wire, that freely supports and positions the vent panel portions relative to the reflector body.

In another preferred embodiment, an open ended sleeve is received in the reflector body and the sleeve is perforated along its length.

In another preferred embodiment, the panel portions are adhesively secured to the reflector body.

Yet another preferred embodiment interconnects the panel portions and adhesively secures the assembly to the reflector body.

DETAILED DESCRIPTION OF THE INVENTION

Figure 1:
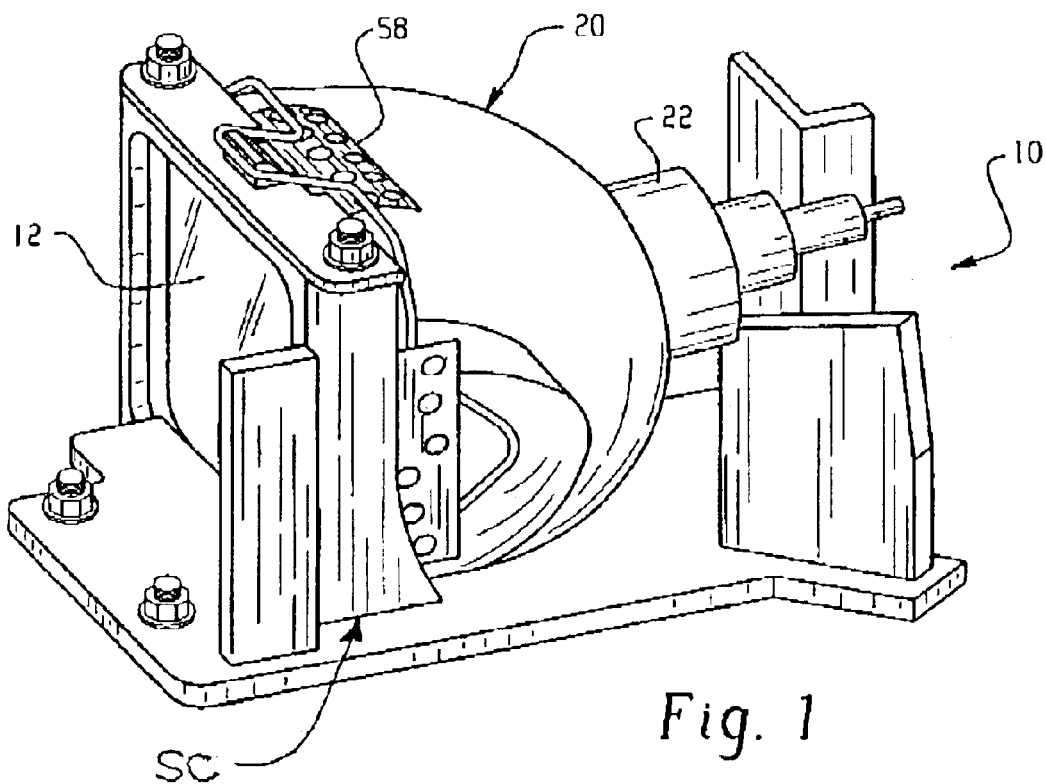
FIG. 1 is a perspective view of a high intensity discharge reflector lamp assembly in accordance with the present invention
Figure 3:
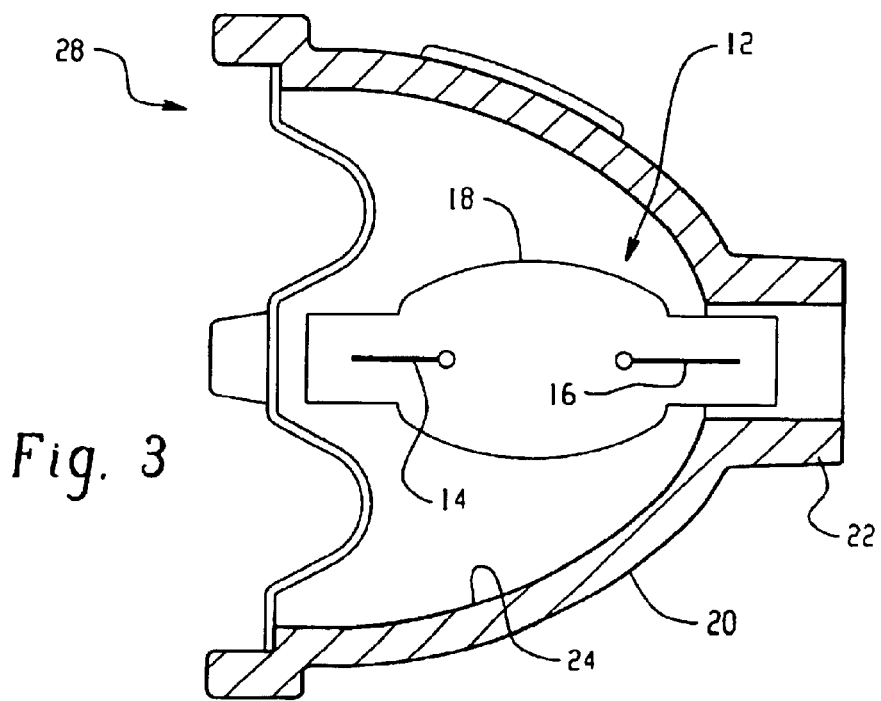
FIG. 3 is a longitudinal cross-sectional view of the reflector body.

A projector lamp assembly is generally identified by reference numeral 10 in FIG. 1. The lamp assembly includes a light source, such a high intensity light source 12, having first and second electrodes 14, 16 extending from opposite axial ends of a bulbous chamber 18 (FIG. 3). As is known in the art, the discharge light source includes first and second leads provided in the first and second legs, respectively that are joined to the electrodes. The electrodes are separated by an arc gap within the chamber 18 and an arc is formed between them in response to electrical power supplied thereto which ionizes a pressurized fill gas sealingly contained within the chamber to emit light therefrom.

Normally, the light source is oriented so that the legs are aligned with the longitudinal axis of the reflector body 20. More particularly, as illustrated in FIG. 3 the first leg 14 is partly received in necked down region 22 of the reflector body, therein locating the light emitting chamber 18 at a focal region of the reflective surface 24 of the reflector body. In this manner, light emitted toward the reflective surface 26 is redirected outwardly through an open end 28 of the reflector body.

Recesses 40 are circumferentially spaced about the open end 28 of the reflector body and extend axially inward toward the necked down region. As will be appreciated, the recesses 40 form side vent openings 42 in the reflector body that allow cooling air flow to reach the enclosed reflector body, or stated another way, allow heat built up in the reflector body to escape. Although four recesses 40 are provided in the square-shaped cross-section of a preferred design of the reflector body adjacent the open end, a greater or lesser number could also be used as desired.

The reflector body is of suitable thickness and strength to contain any non-passive failure of the discharge chamber. The inclusion of the recesses for thermal venting, however, leaves a void in the containment structure that advantageously provides adequate protective features without inhibiting the venting feature.

Figure 4:
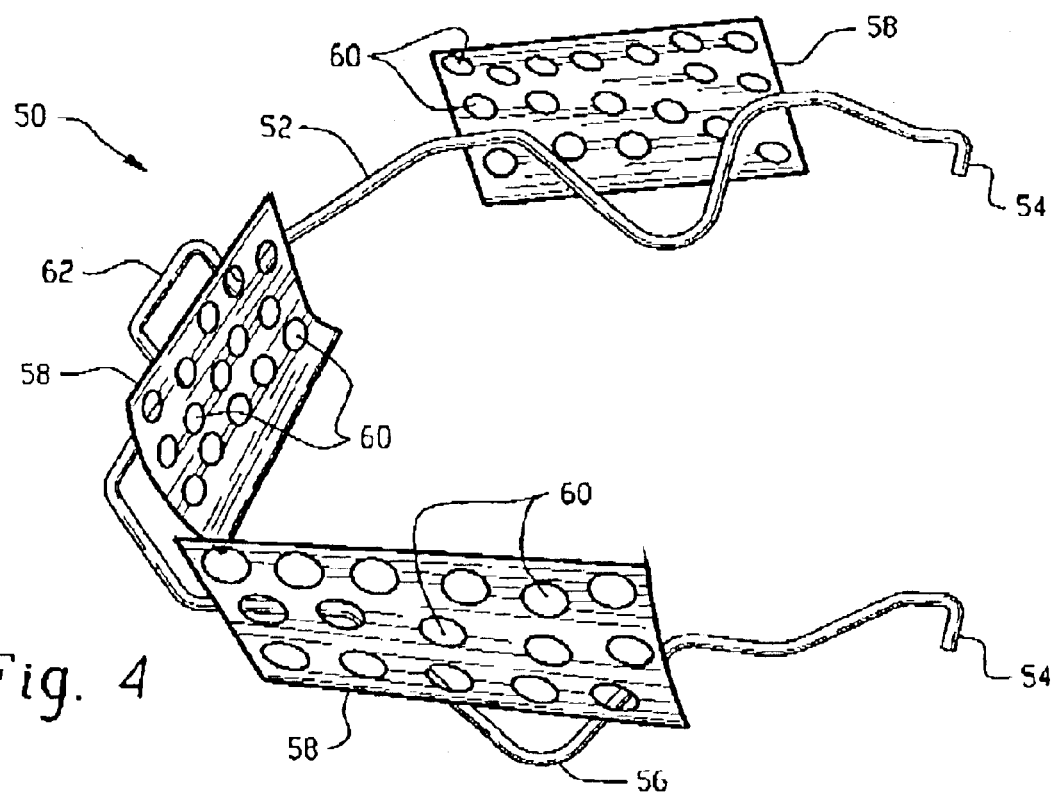
FIG. 4 is a perspective view of a containment structure in accordance with a first preferred embodiment.
Figure 2:
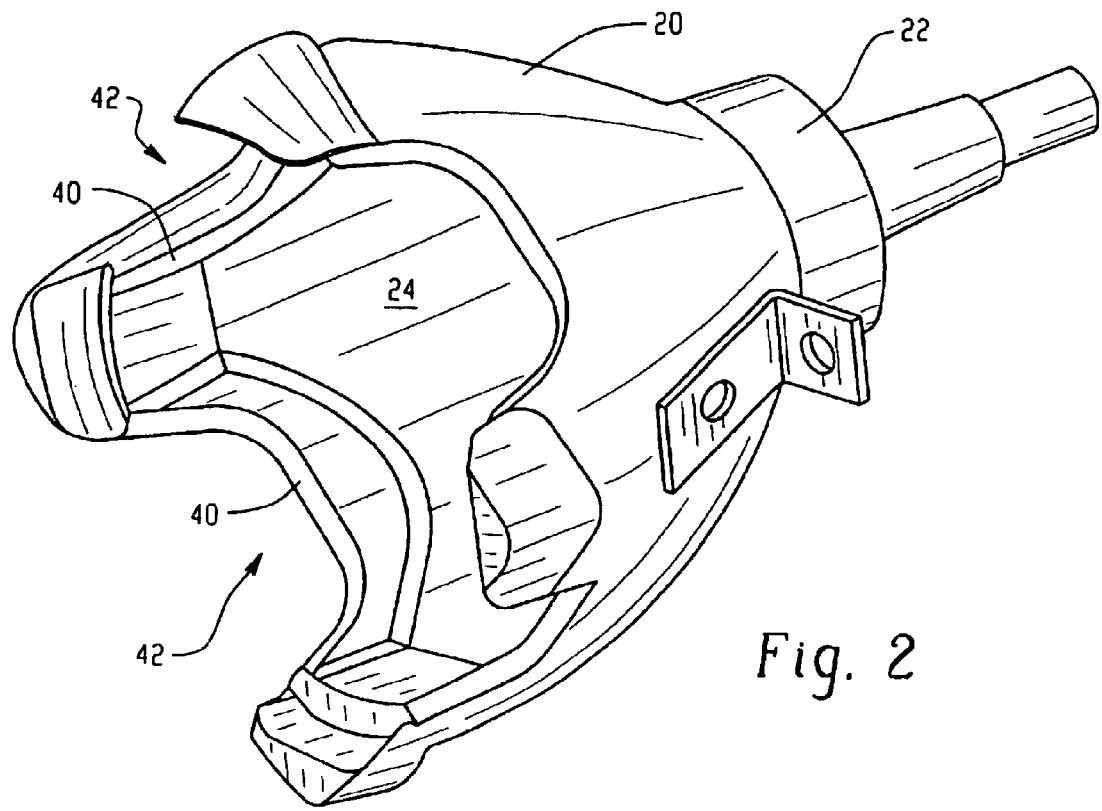
FIG. 2 is a perspective view of the reflector body.

As illustrated in FIG. 1, and separately in FIG. 4, a first preferred embodiment of the containment structure 50 includes a support member or spring form wire 52 that is contoured or bent to wrap about the periphery of the reflector body adjacent the open end 28 thereof. First and second ends 54 of the spring form wire are hook shaped to engage a supporting cage SC that receives the projector lamp assembly. In addition, bent regions 56 are formed in the wire at predetermined locations that align with the recesses in the reflector body. The bent regions allow individual vent panels 58 to be secured, for example by tack welding, to the wire. Vent panels 58 can be configured to match various cutout recess shapes in the corresponding reflector body. Moreover, the vent panels have a series of smally openings 60 (shown here as circular openings) dimensioned to allow sufficient air flow to reach the vent recesses formed in the reflector body. On the other hand, the openings are not so large as to impinge on the structural or protective feature required for containmnent purposes in the event of non-passive failure of the light source.

An additional contour 62 may be formed in the wire so that, like the hook ends 54, an additional engagement region is defined with the supporting cage that receives the lamp assembly. This provides for precise alignment and positioning of the containment structure relative to the lamp assembly and assures that the vent panels are properly located over the recesses in the reflector body. It will be further appreciated that the vent panels can be disposed on opposite sides of the support wire. Since the wire and panels define a separate containment structure relative to the reflector body and lamp assembly, this arrangement is conducive to recycling of the lamp components. In addition, this containment structure does not interfere with installation and removal of the lamp assembly from the support cage as may be necessary. That is, the lamp assembly may periodically require replacement while the wire/vent containment structure can be used repeatedly.

Figure 5:
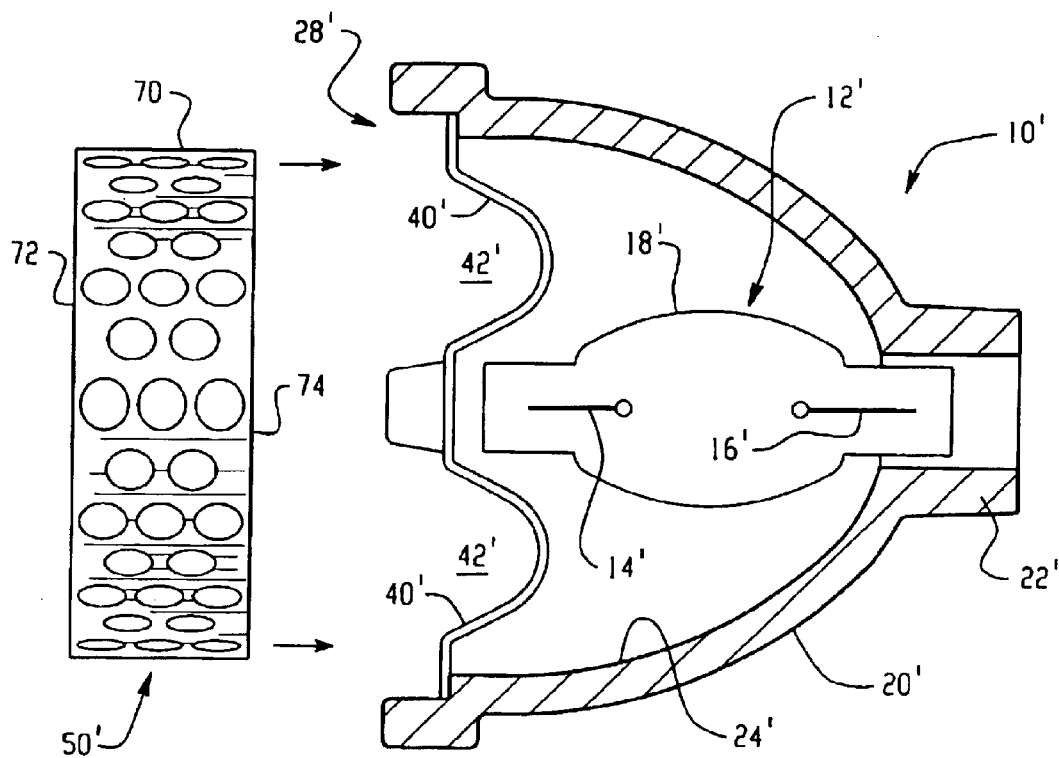
FIG. 5 is a perspective view of a second embodiment of the containment structure.

Turning now to FIG. 5, a second preferred embodiment of the containment structure will be described. For purposes of brevity and understanding, like components will be referred to by like reference numerals with a primed suffix (') while new components will be referred to by new numerals. Here, the containment structure 50' is a hollow square-shaped, cross-sectional screen or basket 70 adapted to be received in a squared end of the reflector body. More particularly, the basket 70 has open first and second ends 72, 74, while the remainder of the basket is preferably circumferentially continuous and dimensioned for receipt within the reflector body open end. The peripheral dimension is such that axial insertion toward the necked down region is further precluded since it abuts against an inner diameter of the reflector body at the juncture of the necked region with the enlarged diameter portion of the reflecting surface 26'. In this manner, the basket is easily mounted and/or removed from the lamp assembly for recycling for subsequent use.

Figure 6:
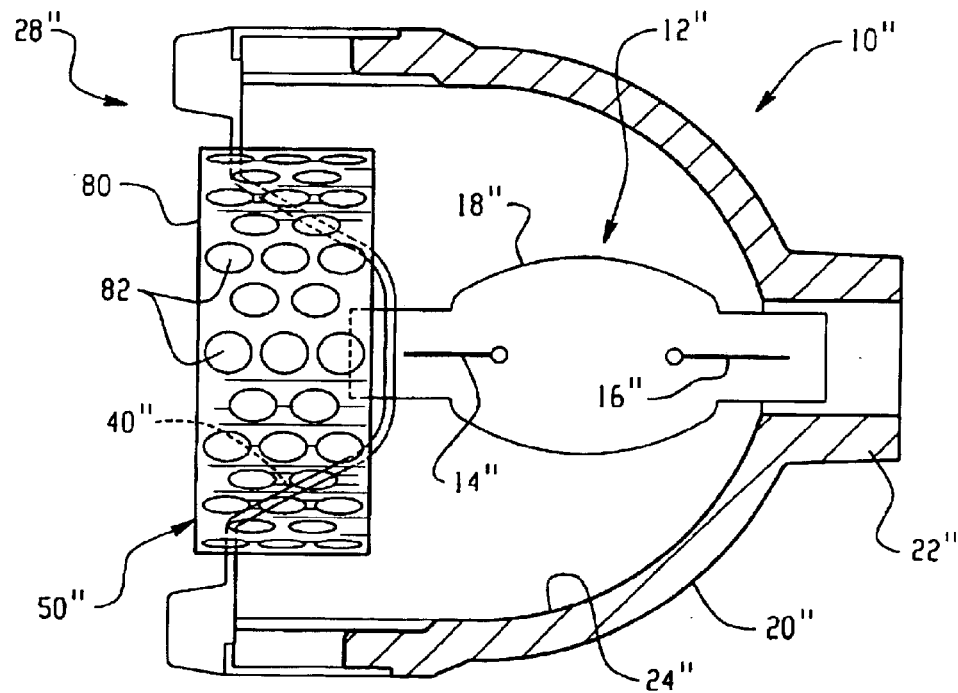
FIG. 6 is a view similar to FIG. 3 and illustrating yet another manner of providing a containment structure.

Yet another preferred form of containment structure 50" is shown in FIG. 6. Here, discrete vent panels 80 are dimensioned for receipt over the recesses 40" in the reflector body. The vent panels include openings 82 that may be the same size, or have different sizes, depending on the location of a particular vent panel, i.e., one where additional protection or venting is desired. The vent panels are adhesively secured to the reflector body and thus dimensioned to be slightly larger than the recesses without forming a unified or continuous containment structure. Thus, although some of the benefits with regard to recyclability are lost, material costs are substantially decreased and greater flexibility is provided for various design parameters. Moreover, these screens may be channeled or adopt suitable shapes to direct air flow in a desired pattern through the recesses of the reflector body. Accordingly, various designs and conformations of these vent panels are contemplated by the present invention.

The invention has been described with reference to the preferred embodiments. Modifications and alterations will occur to others upon reading and understanding this detailed specification. It is intended to include all such modifications and alterations in so far as they come within the scope of the appended claim and equivalents thereof It should also be appreciated that the invention should be defined by the claims and not limited to all or any specific one of the advantages and benefits described herein.

What is claimed is:

1. A discharge lamp assembly comprising:
    a discharge light source;
    a reflector operatively associated with the light source for directing light from the light source in a desired manner, the reflector including pre-formed openings for venting therethrough; and
    a foraminous containment structure disposed in spaced, overlying relation with the respective reflector openings and formed to wrap around a periphery of the reflector.

2. The discharge lamp assembly of claim 1 wherein the containment structure includes discrete panels that are interconnected by a structural member.

3. The discharge lamp assembly of claim 2 wherein the structural member is a wire.

4. The discharge lamp assembly of claim 1 wherein the reflector pre-formed openings are recesses extending axially inward from a first end of the reflector.

5. The discharge lamp assembly of claim 4 wherein the recesses are spaced about a perimeter of the first end.

6. The discharge lamp assembly of claim 1 further comprising a cage that receives the reflector therein, the containment structure securing the reflector to the cage.

7. The discharge assembly of claim 1 wherein the containment structure includes a support wire and individual panels secured to the wire.

8. The discharge lamp assembly of claim 1 wherein the containment structure includes discrete panels disposed in the spaced, overlying relation with the respective reflector openings.

9. A discharge lamp assembly having improved venting and recycling features, the lamp assembly comprising:
    a discharge light source;
    a reflector operatively associated with the light source for directing light from the light source in a desired manner, the reflector including pre-formed openings for venting therethrough; and
    a separate containment structure from the light source and the reflector disposed in spaced, overlying relation with the respective reflector openings and contoured about a periphery of the reflector.

10. The discharge assembly of claim 9 wherein the reflector pre-formed openings are recesses extending axially inward from a first end of the reflector.

11. The discharge lamp assembly of claim 10 wherein the recesses are spaced about a perimeter of the first end.

12. The discharge lamp assembly of claim 9 wherein the containment structure includes discrete panels disposed in the spaced, overlying relation with the respective reflector openings.

13. A discharge lamp assembly having improved venting and recycling features, the lamp assembly comprising:
    a discharge light source;
    a reflector operatively associated with the light source for directing light from the light source in a desired manner, the reflector including pre-formed openings for venting therethrough; and a separate containment structure from the light source and the reflector disposed in spaced, overlying relation with the respective reflector openings and secured to the reflector, and a cage that receives the reflector therein, the containment structure securing the reflector to the cage.

14. A discharge lamp assembly comprising:

a discharge light source;

a reflector operatively associated with the light source for directing light from the light source in a desired manner, the reflector including pre-formed openings for venting therethrough;

a containment assembly dimensioned for receipt within the reflector and circumferentially surrounding the light source; and a cage that receives the reflector therein, the containment assembly securing the reflector to the cage.

15. The discharge assembly of claim 14 wherein the reflector pre-formed openings are recesses extending axially inward from a first end of the reflector.

16. The discharge lamp assembly of claim 15 wherein the recesses are spaced about a perimeter of the first end.

* * * * *